United States Patent [19]

Sopchak et al.

[11] Patent Number: 4,820,553

[45] Date of Patent: Apr. 11, 1989

[54] METHOD FOR PRETREATMENT OF POLYESTERS FOR METAL PLATING

[75] Inventors: Peter Sopchak, Syracuse; Adam L. Skovrinski, Memphis, both of N.Y.

[73] Assignee: Allied-Signal Inc., Morris Township, Morris County, N.J.

[21] Appl. No.: 587,794

[22] Filed: Mar. 9, 1984

[51] Int. Cl.$^4$ .......................... B05D 3/04; C25D 5/54
[52] U.S. Cl. ...................... 427/304; 204/30; 427/305; 427/306; 427/307
[58] Field of Search .............. 427/304–307; 204/30

[56] References Cited

U.S. PATENT DOCUMENTS

| | | | |
|---|---|---|---|
| 3,652,351 | 3/1972 | Guisti | 156/2 |
| 3,668,082 | 6/1972 | Elmore | 204/30 |
| 4,039,714 | 8/1977 | Roubal et al. | 427/306 |
| 4,131,698 | 12/1978 | Deckert | 427/306 |
| 4,315,045 | 2/1982 | Dillard et al. | 427/307 |
| 4,325,991 | 4/1982 | Donovan et al. | 427/307 |
| 4,325,992 | 4/1982 | Donovan et al. | 427/307 |
| 4,335,164 | 6/1982 | Dillard et al. | 427/307 |
| 4,426,253 | 1/1984 | Kreuz et al. | 156/668 |

FOREIGN PATENT DOCUMENTS 54-68877  6/1979  Japan.

*Primary Examiner*—Janyce Bell
*Attorney, Agent, or Firm*—Richard C. Stewart; Gerhard H. Fuchs

[57] ABSTRACT

This invention relates to a process for conditioning the surfaces of polyester and polyamide materials for electroless plating of a metal coating thereon by exposing such materials to a composition comprising a solvent system containing water, and one or more substantially water-soluble organic solvents and an effective amount of solvated hydroxide ions.

5 Claims, No Drawings

METHOD FOR PRETREATMENT OF POLYESTERS FOR METAL PLATING

BACKGROUND OF THE INVENTION

1. Field of the Invention

This invention relates to a process for the conditioning of polyester and polyamide materials and articles constructed of such materials which are to be metal plated through use of conventional electroless and electro plating techniques. More particularly, this invention relates to an improved process for surface conditioning of such materials and such articles so as to provide them with hydrophilic surfaces. This conditioning permits electroless and electroplating of said materials and articles to provide metal plated surfaces which possess superior adhesive properties, as compared to metal surfaces plated onto untreated surfaces. This invention also relates to products produced by the process of this invention.

2. Description of the Prior Art

In recent years, electroplating and metallic coating of plastics has become of ever increasing importance. In order to manufacture plastics having firmly bonded metal coatings, the plastic must be subjected to a pretreatment step, during which the surfaces of the plastic are treated to increase the peel strength and adhesion of metal surfaces coated thereon. Heretofore, various methods have been employed in such a pretreatment step. For example, in one such prior art method, the surfaces of the plastic are treated with a mixture of chromium trioxide, sulfuric acid and water, or a mixture of such ingredients and phosphoric acid. While relatively effective, this method suffers from a number of disadvantages. For example, the efficiency of this method is very much dependent on the type of plastic to be treated; and accordingly it is mainly confined to use in the pretreatment of a narrow class of plastics. Thus, the process does not have universal applicability for a wide range of assorted plastics.

Another disadvantage of this known method is that the relative amounts of components in the chromium trioxide containing pre-treatment solution must be maintained within a pre-determined and rather narrow range of concentrations. Only deviations of a few percent from these optimum amounts are permissible. Otherwise, on subsequent chemical deposition of the metal, the plastic surface is not completely coated by the metal and/or the entire coating does not possess sufficiently high peel strength. In addition, in this known method, the pretreatment solution becomes useless as soon as the concentration levels of the degradation products of the plastic and of the trivalent chromium compounds in the solution reach a certain level. Thus, constant analytical supervision and dosing of the chemicals consumed and monitoring of the degradation products produced during the conduct of this known pretreatment method is required. This continual control of the process considerably complicates its conduct.

Still another disadvantage of this known pretreatment process results from difficulties associated with the disposal of the used composition. To eliminate the used pretreatment composition, it is necessary to reduce the hexavalent chromium compounds and then to neutralize the reduction product. In the neutralization procedure, large amounts of highly voluminous chromium hydroxide are formed, the removal of which considerably encumbers the disposal of the used composition. Thus, the disposal of the used pretreatment composition also complicates the conduct of the process and requires considerable expenditures of time, capital, technical apparatus and plants.

Lastly, the pretreatment composition of this known process is very corrosive, and extensive washings with water are required to completely remove it from the plastic surface being pretreated. The result is a further increase in process time and expense.

Another prior art process for pretreating plastic surfaces to enhance the peel strength of metal surfaces electroless or electroplated thereon is disclosed in U.S. Pat. No. 4,039,714. In this process, the surfaces of the plastic to be electroplated is pretreated by exposing them to be electroplated is pretreated by exposing them to an atmosphere containing sulfur trioxide. This known pretreatment process also suffers from several inherent disadvantages. For example, sulfur trioxide is an extremely toxis substance, which reacts with atmospheric moisture to form sulfuric acid which is extremely corrosive and dangerous. Thus, when using sulfur trioxide extreme care must be taken to prevent contact with human skin. Furthermore, sulfur trioxide reacts violently with certain organic materials producing heat, which results in an additional hazard to users of the process. The dangerous nature of sulfur trioxide results in an increase in the time, cost and equipment required to use this process. Lastly, cumbersome and costly ammonia neutralization of sulfur trioxide including disposal of the ammonia sulfate by product is also inherent to this etching process.

SUMMARY OF THE INVENTION

The present invention is directed to a method of treating surfaces composed of polyester and/or polyamide materials to improve adhesion of a metal coating deposited upon said surfaces from electroless plating bath, said method comprising exposing said surfaces to a composition which comprises a solvent system which comprises water and one or more substantially water-soluble organic solvents and solvated hydroxyl ions. Polyester and polyamide materials treated in accordance with the process of this invention are especially useful as the polymeric substrate in electroless plating processes. Such materials can be electroless plated immediately after pretreatment or at any time after pretreatment to provide metal coated surfaces having exceptionally high peel strengths as compared to metal coated plastic surfaces in which the polymeric substrate has not been pretreated. Following the electroless plating procedure additional metal can be plated onto the resulting metal plated surfaces through use of electroplating techniques.

One unique advantage of the etch process of this invention as compared to conventional chromium trioxide etching processes is the elimination of the possibility of cross contamination of hexavalent chromium which is experienced in conventional systems. This is critical in electroless plating systems because as little as 5 ppm of hexavalent chromium poisons electroless nickel solutions completely. A further advantage of the process of this invention is the alleviation of drainage problems between tanks and the cross contamination experienced in chromium trioxide systems where as many as 7-10 rinses are required after the hexavalent chromium etch step.

Such materials which have been pretreated and metal plated in accordance with this invention are useful for many purposes. For example, such metal plated plastics can be used for EMI/RFI shielding applications, decorative purposes and/or for protection. Such metal plated plastics can also be used in the manufacture of printed circuit boards, and to increase the strength and surface conductance of plastics. The process of this invention also provides parts which are considerably lighter than solid metal parts, yet which still possess metal conductive properties, and metal surface characteristics and other like metal characteristics.

DETAILED DESCRIPTION OF THE INVENTION

In the process of this invention the surfaces of the polyester and/or polyamide material to be pretreated are exposed to a composition which comprises a solvent system comprising water and one or more water-soluble organic solvents containing an "effective amount" of solvated hydroxyl ions. As used herein "solvated hydroxyl ions" are species of the formula $OH^-$ which are in solution, and an "effective amount" is an amount of hydroxyl ions in solution which when contacted with the surfaces of the polyester and/or polyamide material is effective to condition such surfaces such that subsequent electroless plating of a metal thereon will provide a metal coating having enhanced peel strength as compared to the peel strength of metal coated onto untreated surfaces. While not intended to limit the scope of the invention in any way, it is believed that the hydroxyl ions in combination with the water-soluble organic solvent functions to etch the treated surfaces and render them hydrophilic. Normally, the greater the weight percent of hydroxyl ions and water-soluble organic solvents in the exposing composition, the greater the degree of etching and the greater the increase in the hydrophilic character of the treated surfaces. Conversely, the less the amount of hydroxyl ions and water-soluble organic solvents in the exposing composition, the less the degree of etching and the less the increase in the hydrophilic character of the treated surfaces. The quantity of hydroxyl ions employed in a particular situation will depend on a number of factors, as for example the exposing temperature, the susceptibility of the particular polyamide or polyester material to attack by hydroxyl ions and water-soluble organic solvents and the duration of exposure. Thus, variations in these parameters can greatly increase or decrease the speed and/or degree of etching and the extent to which the hydrophilic character of the plastic surfaces are modified. Thus, smaller or larger quantities of hydroxyl ions and water-soluble organic solvents can be employed depending on whether these operational parameters are maximized or minimized. In general, however, when employing preferred operational parameters, good results are achieved when the quantity of hydroxyl ions in solution is at least about 0.1 weight percent based on the total weight of the exposing composition surrounding the plastic surfaces being conditioned. In the preferred embodiments of this invention, the quantity of hydroxyl ions in solution which is employed is at least about 5 weight percent based on the total weight of the composition, and in the particularly preferred embodiments of this invention, the quantity of hydroxyl ions in solution is at least about 10 weight percent on the same basis. Amongst these particularly preferred embodiments, those in which the quantity of hydroxyl ions in solution is at least about 20 weight percent based on the total weight of the solution are most preferred.

The upper weight percent of hydroxyl ions is not critical, and best results would be be achieved if the composition composed of 100% hydroxyl ions in solution is employed. However, due to the economics of generating the solution and/or the inherent solubilities of hydroxyl ions in the solvent, composition composed predominantly of greater than about 50 weight percent hydroxyl ions in solution are normally not used.

The solvated hydroxyl ions are generated by dissolving a source of hydroxyl ions in the solvent system. The source of hydroxyl ions employed is not critical and any compound containing a hydroxyl moiety can be employed, provided that the compound can be dissolved in the solvent system to the extent required. Illustrative of suitable sources of hydroxyl ions are non-metal hydroxide compounds such as ammonium hydroxide and the like, and metal hydroxide compounds such as alkali and alkaline earth metal hydroxides as for example sodium hydroxide, potassium hydroxide, lithium hydroxide, calcium hydroxide, barium hydroxide, magnesium hydroxide and the like. Ammonium hydroxide and alkali metal hydroxide compounds are preferred sources of hydroxyl ions. Ammonium hydroxide, potassium hydroxide and sodium hydroxide are particularly preferred sources of hydroxyl ions, and sodium hydroxide is most preferred primarily because of its low cost.

The second component of the exposing composition is a solvent system comprising water and one or more substantially water-soluble organic solvents. The water is added to the system primarily to dissolve the hydroxyl ions. Thus, the amount of water employed is not critical and can vary widely provided that it is in an amount sufficient to insure that an effective amount of hydroxyl ions is in solution. Thus, the system can contain as little as about 5 weight percent water based on the total weight of the system or even less in those instances where the organic solvents employed are polar, and themselves capable of solubilizing hydroxyl ion, or as much as 85 weight percent water or more in other instances. In the preferred embodiments of the invention, the amount of water is from about 30 to about 85 weight percent based on the total weight of the solvent system and in the particularly preferred embodiments is from about 45 to about 75 weight percent on the same basis. Amongst these particularly preferred embodiments, most preferred are those embodiments in which the amount of water is from about 50 to about 66 weight percent based on the total weight of the solvent system.

Organic solvents which can be used in the process of this invention can be varied widely provided that the solvents are substantially water-soluble, and further provided that they are capable of wetting and swelling the polymer. A solvent is substantially water-soluble within the meaning of this invention if it is capable of forming a solution with water containing 5 weight percent or more of the solvent based on the total weight of the solution. Useful organic solvents include water-soluble organic liquids such as alkanols having from 1 to about 7 carbon atoms, such as methanol, ethanol, propanol, isopropanol, butanol, isobutanol, and the like; polyols such as glycerol, ethylene glycol, trimethylene glycol, 1,4-butanediol, erythritol, 1,4-pentanediol, propylene glycol, hexamethylene glycol and the like; ether alcohols such as furfuryl, tetrahydrofurfuryl and the like; water-soluble ketones and aldehydes, such as formaldehyde, acetone, acetaldehyde and the like; and aromatic alcohols such as benzyl alcohol and the like. Preferred for use in the practice of this invention are alkanols having from 1 to about 4 carbon atoms, and particularly preferred are alkanols having from 1 to about 3 carbon atoms. Amongst these particularly preferred embodiments, most preferred are those embodiments in which the organic solvent is methanol and ethanol.

The amount of the organic solvent contained in the solvent system can vary widely. Generally, the composition will contain from about 15 to about 70 weight percent organic solvent based on the total weight of the solvent system. In the preferred embodiments of the invention, the composition will include from about 20 to about 60 weight percent of the organic solvent, and in the particularly preferred embodiments will include from about 25 to about 55 weight percent of the solvent on the aforementioned basis. Amongst these particularly preferred embodiments, most preferred are those embodiments in which the amount of the organic solvent is from about 33 to about 50 weight percent based on the total weight of the solvent system.

Process temperatures are not critical and can be varied widely as desired, provided that the temperature is low enough to prevent substantial degradation of the polyamide and/or polyester material being conditioned and is high enough to allow the etching process to occur. As is indicated above there is a relationship between exposure times, exposure temperatures and the quantity of hydroxyl ions in the exposing solution. Thus, the higher the exposure temperature, the shorter the exposure times and the smaller the quantity of hydroxyl ions required to provide acceptable results, and, conversely, when lower temperatures are employed, longer exposure times and larger quantities of hydroxyl ions may be required. When operating under preferred conditions, the process can be conveniently carried out at a temperature as low as about $-10°$ C. and lower, and up to a temperature of about 150° and higher, depending on the particular polyamide and/or polyester material being etched. The process is usually carried out at a temperature of between about 15° C. and about 90° C., and preferably from about 20° C. to about 50° C., mainly for convenience of operation.

Process pressures are also not critical and can be varied widely. The process can be carried out at sub-atmospheric, atmospheric or super-atmospheric pressure. However, the process is usually conducted at atmospheric or autogenous pressure for convenience.

In the first step of the process of this invention, the polyamide and/or polyester material is exposed to the composition comprising the effective amount of solvated hydroxyl ions and the organic solvent/water solvent system for a time sufficient to etch the surfaces of such material and to render them hydrophilic such that on electroless plating of metal thereon the adhesion of the metal coating is improved to the extent desired. As was noted hereinabove, the duration of exposure will depend on a number of factors including, exposure temperatures, the quantity of hydroxyl ions and water-soluble organic solvent in the exposing composition. Exposure times are not critical and can be varied over a wide range as desired provided that the aforementioned result is obtained. For example, exposure times can vary from about a few seconds up to about 24 hours or more. In most instances, however, exposure times will vary from 1 to 5 seconds up to about 1 to 2 hours under the preferred process conditions, and these exposure times represent the preferred range of exposure times.

It should be appreciated that the preferred exposure time, exposure temperature and concentration of hydroxyl ions in the exposing atmosphere for any particular application will depend on the type of plastic material being subjected to the process of this invention. Thus, the preferred set of process parameters for any particular application will preferably be selected in accordance with the chemical structure and reactivity of the polyamide and/or polyester material in such a manner that optimum etching of the surface and changes in the hydrophilic character of the surface for a particular purpose is provided.

Illustrative of polymers which may be utilized in the process of this invention are synthetic linear polycarbonamides characterized by the presence of recurring carbonamide groups as an integral part of the polymer chain which are separated from one another by at least two carbon atoms. Polyamides of this type include polymers, generally known in the art as nylons, obtained from diamines and dibasic acids having the recurring unit represented by the general formula:

—NHCORCONHR$^1$— in which R is an alkylene group of at least two carbon atoms, preferably from about 2 to about 10; and R$^1$ is selected from R and phenyl groups. Also included are copolyamides and terpolyamides obtained by known methods, as for example, by condensation of hexamethylene diamine and a mixture of dibasic acids consisting of terephthalic acid and adipic acid. In addition to the above polyamides, also useful are polyamides obtained from amino acids and derivatives thereof, as for example, lactams.

Polyamides of the above description are well known in the art and include, for example, the copolyamide of 30% hexamethylene diammonium isophthalate and 70% hexamethylene diammonium adipate, the copolyamide of up to 30% bis-(p-amidocyclohexyl)methylene, and terephthalic acid and caprolactam, poly(hexamethyleneadipamide) (nylon 66), poly(4-aminobuytric acid) (nylon 4), poly(7-aminoheptanoic acid) (nylon 7), poly(8-aminooctanoic acid) (nylon 8), poly(6-aminohexanoic acid) (nylon 6), poly(hexamethylene sebacamide) (nylon 6,10), poly(heptamethylene pimelamide) (nylon 7,7), poly(octamethylene suberamide) (nylon 8,8), poly(hexamethylene sebacamide) (nylon 6,10) poly(nonamethylene azelamide) (nylon 9,9), poly(decamethylene azelamide) (nylon 10,9), poly(decamethylene sebacamide (nylon 10,10), poly[bis(4-aminocyclohexyl)methane-1,10-decanedicarboxamide]((Qiana) (trans)), poly(m-xylylene adipamide), poly(p-xylylene sebacamide), poly(2,2,2-trimethylhexamethylene terephthalamide), poly(piperazine sebacamide), poly(metaphenylene isophthalamide) (Nomex), poly(p-phenylene terephthalamide) (Kevlar), poly(11-aminoundecanoic acid) (nylon 11), poly(12-aminododecanoic acid) (nylon 12), polyhexamethylene isophthalamide, polyhexamethylene terephthalamide, poly(9-aminononanoic acid) (nylon 9) polycaproamide, or combinations thereof. The polyamide for use in the most preferred embodiments of this invention is polycaprolactam which is commercially available from Allied Corporation under the tradename Capron TM Nylon.

Other polymers which may be employed in the process of this invention are linear polyesters. The type of polyester is not critical and the particular polyester chosen for use in any particular situation will depend essentially on the physical properties and features, i.e. flexibility, hardness, toughness, desired in the final shaped article of manufacture. Thus, a multiplicity of linear thermoplastic polyesters having wide variations in physical properties are suitable for use in the process of this invention.

The particular polyester chosen for use can be a homo-polyester or a co-polyester, or mixtures thereof as desired. Polyesters are normally prepared by the condensation of an organic dicarboxylic acid and an organic diol, and, therefore, illustrative examples of useful polyesters will be described hereinbelow in terms of these diol and dicarboxylic acid precursors.

Polyesters which are suitable for use in this invention are those which are derived from the condensation of aromatic, cycloaliphatic, and aliphatic diols with aliphatic, aromatic and cycloaliphatic dicarboxylic acids. Illustrative of useful aromatic diols, are those having from about 6 to about 12 carbon atoms. Such aromatic diols include bis-(p-hydroxyphenyl) ether; bis-(p-hydroxyphenyl) thioether; (bis-(p-hydroxyphenyl)-sulphone); (bis-(p-hydroxyphenyl)-methane); 1,2-(bis-(p-hydroxyphenyl)-methane); 1-phenyl-(bis-(p-hydroxyphenyl)methane); diphenyl-(bis-(p-hydroxyphenyl)-methane); 2,2-bis(4'-hydroxy-3'-dimethylphenyl)propane); 1,1- or 2,2-(bis(p-hydroxyphenyl)-butane); 1,1-dichloro- or 1,1,1-trichloro-2,2-(bis-(p-hydroxyphenyl)-ethane); 1,1-(bis(p-hydroxyphenyl)-cyclopentane); 2,2-(bis-(p-hydroxyphenyl)-propane) (bisphenol A); 1,1-(bis-(p-hydroxyphenyl)-cyclohexane) (bisphenol C); p-xylene glycol; 2,5-dichloro-p-xylylene glycol; p-xylene-diol; and the like.

Suitable cycloaliphatic diols include those having from about 5 to about 8 carbon atoms. Exemplary of such useful cycloaliphatic diols are 1,4-dihydroxy cyclohexane; 1,4-dihydroxy methylcyclohexane; 1,3-dihydroxycyclopentane; 1,5-dihydroxycycloheptane; 1,5-dihydroxycyclooctane; 1,4-cyclo-hexane dimethanol; and the like. Polyesters which are derived from aliphatic diols are preferred for use in this invention. Useful and preferred aliphatic diols include those having from about 2 to about 12 carbon atoms, with those having from about 2 to about 6 carbon atoms being particularly preferred. Illustrative of such preferred diol precursors are 1,2- or 1,3-propylene glycol; ethylene glycol, neopentyl glycol, pentyl glycol, 1,6-hexanediol, 1,4-butanediol and geometrical isomers thereof. Propylene glycol, ethylene glycol and 1,4-butanediol are particularly preferred as diol precursors of polyesters for use in the conduct of this invention.

Suitable dicarboxylic acids for use as precursors in the preparation of useful polyesters are linear and branched chain saturated aliphatic dicarboxylic acids, aromatic dicarboxylic acids and cycloaliphatic dicarboxylic acids. Illustrative of aliphatic dicarboxylic acids which can be used in this invention are those having from about 2 to about 50 carbon atoms, as for example, oxalic acid, malonic acid, dimethyl-malonic acid, succinic acid, octadecylsuccinic acid, pimelic acid, adipic acid, trimethyladipic acid, sebacic acid, suberic acid, azelaic acid and dimeric acids (dimerization products of unsaturated aliphatic carboxylic acids such as oleic acid) and alkylated malonic and succinic acids, such as octadecylsuccinic acid, and the like.

Illustrative of suitable cycloaliphatic dicarboxylic acids are those having from about 6 to about 15 carbon atoms. Such useful cycloaliphatic dicarboxylic acids include 1,3-cyclobutanedicarboxylic acid, 1,2-cyclopentanedicarboxylic acid, 1,3- and 1,4-cyclohexanedicarboxylic acid, 1,3- and 1,4-dicarboxymethylcyclohexane and 4,4'-dicyclohexyldicarboxylic acid, and the like.

Exemplary of useful cycloaliphatic, aliphatic and aromatic polyesters which can be utilized in the practice of their invention are poly(ethylene phthalate), poly(cyclohexylenedimethylene terephthalate), poly(ethylene dodecate), poly(butylene terephthalate), poly[ethylene(2,7-naphthalate)], poly(metaphenylene isophthalate), poly(glycolic acid), poly(ethylene succinate), poly(ethylene adipate), poly(tetramethylene adipate), poly(ethylene azelate), poly(ethylene sebacate), poly(decamethylene adipate), poly(decamethylene sebacate), poly($\alpha,\alpha$-dimethylpropiolactone), poly(parahydroxybenzoate) (Ekonol), poly(ethylene oxybenzoate) (A-tell), poly(ethylene isophthalate), poly(tetramethylene terephthalate), poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylidene dimethylene terephthalate) (Kodel) (cis), and poly(1,4-cyclohexylidene dimethylene terephthalate) (Kodel) (trans).

Polyester compounds prepared from the condensation of a diol and an aromatic dicarboxylic acid are preferred for use in this invention. Illustrative of such useful aromatic carboxylic acids are terephthalic acid, isophthalic acid and a o-phthalic acid, 1,3-, 1,4-, 2,6- or 2,7-naphthalenedicarboxylic acid, 4,4'-diphenyldicarboxylic acid, 4,4'-diphenylsulphone-dicarboxylic acid, 1,1,3-trimethyl-5-carboxy-3-(p-carboxyphenyl)-indane, diphenyl ether 4,4'-dicarboxylic acid, bis-p(carboxyphenyl)methane and the like. Of the aforementioned aromatic dicarboxylic acids based on a benzene ring such as terephthalic acid, isophthalic acid, orthophthalic acid are preferred for use and amongst these preferred acid precursors, terephthalic acid is particularly preferred.

In the most preferred embodiments of this invention, poly(ethylene terephthalate), poly(butylene terephthalate), and poly(1,4-cyclohexane dimethylene terephthalate), are the polyesters of choice. Among these polyesters of choice, poly(ethylene terephthalate) is most preferred.

The method of producing the composition containing the solvated hydroxyl ions employed in the process of the present invention is not critical and conventional procedures may be employed. For example, an appropriate amount of one or more sources of hydroxyl ions, such as alkali and alkaline earth metal hydroxide compounds i.e. sodium hydroxide, potassium hydroxide, lithium hydroxide, calcium hydroxide, barium hydroxide, magnesium hydroxide, ammonium hydroxide, and the like is dissolved in a suitable solvent system (containing water and one or more substantially water soluble organic solvents) which can dissolve the hydroxide compounds to the desired extent and which is not reactive with such compounds. Illustrative of useful nonreactive solvent systems are mixtures of water, and polar organic solvents such as ethyl acetate, ethanol, methanol, dimethyl formamide, dimethyl sulfoxide and the like. In the particularly preferred embodiments of this invention, a solution of an alkali metal hydroxide as for example, sodium hydroxide, lithium hydroxide and potassium hydroxide or ammonium hydroxide in a solvent system containing water and one or more alkanols such as methanol, ethanol, propanol and the like is employed.

After being subjected to the process of this invention, the treated surfaces are preferably washed with water to remove any solution adhering to the treated plastic surfaces. The surfaces can then be electroless plated, which may be followed by electro plating, by conventional means to provide polymeric materials and polymeric articles having uniform and well adhering copper, brass, cadmium, chromium, nickel, gold, platinum, zinc and like metal surface layers.

Polyester and/or polyamide materials treated in accordance with the process of this invention followed by conventional electroless plating, and optionally by electroplating, have many uses. For example, such plated surfaces can be used for EMI/RFI shielding on electronic housings as well as for decorative purposes. The metal surfaces also provide a protective covering against abrasion and the like. In addition, polyamide and/or polyester materials metal plated in accordance with the process of this invention can be used in the manufacture of printed circuit boards. Such boards are flat plastic plates plated with metals such as copper and the like through use of conventional techniques.

The following specific examples are present to more particularly illustrate the invention.

EXAMPLE I

A solution of 3 parts water and 1 part ethanol and 20% aqueous potassium hydroxide solution (based on total volume) was prepared. Samples of Petra ®, (polyethylene terephthlate, a polyester resin manufactured and sold by Allied Corporation) was immersed in the solution at room temperature for a period of 20 minutes. The samples were then rinsed in distilled water at room temperature for one minute to remove the etching solvent The samples were then subjected to a conventional electroplating procedure as follows:

(1) The etched samples are immersed in a palladium catalyst activator solution comprised of Macuplex Activator D-34, manufactured and sold by MacDermid Inc. The activation solution is an aqueous solution containing palladium, and stannous, stannic, and hydrogen chlorides. The activator solution was maintained at 28° C. and the samples were immersed for 2 minutes. After immersion, the samples were rinsed in distilled water for 1 minute at ambient temp. The samples were then immersed in an accelerator solution of hydrochloric acid, stannic chloride and water (Macuplex D-45 Accelerator, MacDermid, Inc.) for 2 min. at 50° C. and again rinsed in distilled water at ambient temp.

(2) The activated samples were then immersed in an electroless copper plating bath. This bath was prepared by mixing 6% by volume Enplate Cu-750 A (Enthone Inc.), 5% by volume Enplate CU-750 B (Enthone Inc.), 2.25% by volume Enplate CU-750 C (Enthone Inc.), and 0.5% by volume 37% formaldehyde. The samples were immersed for 15 min. at 25° C. followed by a 1 min. rinse with distilled water.

(3) The samples were reactivated by immersion in an aqueous solution comprised of 1.5% by volume Enplate 440 (Enthone Inc.) and 1% by volume concentrated hydrochloric acid held at 25° C. for 2.5 min. The samples were removed from the activation solution and rinsed with distilled water for 1 minute. Finally, the samples were placed in an electroless nickel plating bath which was prepared by mixing 6% by volume Enplate NI-419 A and by volume Enplate NI-419 B, (Enthone, Inc.) The pH of the solution was adjusted to 8.8-9.0 by addition of ammonium hydroxide. The samples were immersed in this bath for 5 minutes at 25° C. followed by a 1 minute rinse with distilled water.

(4) The quality of the electropated metal was evaluated as follows: Since peel strength is only a relative measure of the adhesive bond of metal to plastic and except, for certain singular cases, does not represent the enviroment associated with the end application of the plated plastic or the forces brought to bear upon the plated plastic in those environments, a much more applicable and stringent test of adhesive quality particularly for EMI/RFI applications involves thermal cycling of the plated plastic. In these experiments, to be considered acceptable, plated plastics have to survive at least three successive −40° C. to +120° C. temperature cycles without blistering, cracking, peeling or incurring any other physical deterioration. Plated plastics were also subjected to a qualitative tape peel test. The plating was cross hatched with a razor blade and adhesive tape (Scotch Magic Tape 810) applied firmly to the cross hatched surface. The tape was peeled off rapidly and the amount of plating peeled off noted. An acceptable rating for plated plastic required that no metal be peeled off in this test. Using the aforementioned procedure the plates were evaluated and rated acceptable.

EXAMPLE II

A solution of 1 part water and 1 part ethanol plus 20% aqueous potassium hydroxide, based on total volume, was prepared. Samples of Valox ®, (polybutylene terephthlate, a polyester resin manufactured and sold by General Electric Corporation) were immersed in the solution, maintained at 50° C., for 40 minutes. The samples were then rinsed in distilled water at room temperature for 1 minute, to remove the etching solvent for subsequent conventional electroplating. Commercially available proprietary plating solutions were used. The etched plastics were plated as described in the following procedure:

(1) the etched samples are immersed in a palladium catalyst activator solution comprised of Macuplex Activator D-34, from MacDermid Inc., which is an aqueous solution containing palladium, stannous, stannic, and hydrogen chloride. This solution was maintained at 28° C. and the samples were immersed for 2 minutes followed by a 1 minute rinse in distilled water at ambient temperature.

(2) They were then immersed in an accelerator solution of hydrochloric acid, stannic chloride and water (Macuplex D-45 Accelerator, MacDermid, Inc.) for 2 minutes at 50° C. and again rinsed in distilled water minute at ambient temperature.

(3) The samples were then immersed in an electroless copper plating bath. This bath was prepared by mixing 6% by volume Enplate Cu-750 A (Enthone Inc.), 5% by volume Enplate CU-750 B (Enthone Inc.), 2.25% by volume Enplate CU-750 C (Enthone Inc.), and 0.5% by volume 37% formaldehyde, The samples were immersed for 15 min. at 25° C. followed by a 1 minute rinse with distilled water.

(4) Next, the samples were reactivated in an aqueous solution comprised of 1.5% by volume Enplate 440 (Enthone Inc.) and 1% by volume of concentrated hydrochloric acid by immersing the samples in the solution for 2.5 minutes at 25° C. followed by a 1 minute rinse with distilled water.

(5) Finally, the samples were placed in an electroless nickel plating bath which was prepared by mixing 6% by volume Enplate NI-419 A and 9% by volume Enplate NI-419 B, (Enthone, Inc.)

The pH of the solution was adjusted to 8.8-9.0 by addition of ammonium hydroxide. The samples were immersed in this bath for 5 minutes at 25° C. followed by a 1 minute rinse with distilled water.

Using the procedure of Example I, the metal plates were evaluated and were acceptable.

EXAMPLE III

With appropriate selection of polyester and polyamide materials, and other process parameters, a wide variety of such materials can be treated and electroplated in accordance with the process of this invention to provide metal plated surfaces having enhanced peel strength. Illustrative process parameters of are set forth in the following TABLE IV.

The foregoing detailed description of the invention has been given for clearness of understanding only, and no unnecessary limitations are to be understood therefrom. The invention is not limited to the exact details herein shown and described, and will encompass obvious modifications which will occur to those of skill in the art in light of the appended claims.

What is claimed is:

1. In an improved process for metal plating a polyamide material by conditioning said material to improve metal adhesion and depositing a metal coating upon said conditioned surface from an electroless plating bath, wherein said improvement comprises a conditioning step in which said material is exposed to a composition comprising a solvent system containing water and one or more substantially water-soluble organic solvents and an effective amount of solvated hydroxyl ions.

2. An improved process for plating one or more metals onto the surfaces of a polyamide material which comprises:

TABLE IV

| Exp. No. | % by Weight Hydroxide[1] | Solvent System[1] % by Weight Organic Solvent | Duration of Treatment (Mins.) | Temp °C. | Peel Strength | Polymer |
|---|---|---|---|---|---|---|
| 1 | .1% NaOH | 10% Methyl Alcohol | 5 | 100 | Acceptable | poly(glycolic Acid) |
| 2 | .5% KOH | 20% Acetone | 25 | 20 | Acceptable | poly(ethylene succinate) |
| 3 | 10% NH$_4$OH | 15% Ethylene Glycol | 60 | 90 | Acceptable | poly(ethylene adipate) |
| 4 | 20% LiOH | 30% Dimethyl Amine | 50 | 180 | Acceptable | poly(tetramethylene adipate) |
| 5 | 10% NaOH | 19% Isopropal Alcohol | 40 | 15 | Acceptable | poly(ethylene azelate) |
| 6 | 5% KOH | 20% Ethyl Ether | 85 | 200 | Acceptable | poly(ethylene sebacate) |
| 7 | 30% LiOH | 18% Benzyl Alcohol | 100 | 240 | Acceptable | poly(decamethylene adipate) |
| 8 | 5% NH$_4$OH | 33% Dodecyl Alcohol | 360 | 15 | Acceptable | poly(decamethylene sebacate) |
| 9 | 25% NaOH | 18% Ethyl Alcohol | 10 | 25 | Acceptable | poly(α,α-dimethylpropiolactone |
| 10 | 15% KOH | 16% Ethyl Alcohol | 15 | 40 | Acceptable | poly(para-hydroxybenzoate) (Ekonol) |
| 11 | 2% NaOH | 3% Methyl Alcohol | 90 | 85 | Acceptable | poly(ethylene oxybenzoate) (A-tell) |
| 12 | 19% NH$_4$OH | 35% Acetaldehyde | 600 | 100 | Acceptable | poly(ethylene isophthalate) |
| 13 | 25% NaOH | 40% Isobutanol | 100 | 90 | Acceptable | poly(ethylene terephthalate) |
| 14 | 35% KOH | 16% Glycerol | 120 | 110 | Acceptable | poly(tetramethylene isophthalate) |
| 15 | 30% NH$_4$OH | 18% Heptyl Alcohol | 150 | 120 | Acceptable | poly(tetramethylene terephthalate) |
| 16 | 25% KOH | 38% Pentyl Alcohol | 100 | 15 | Acceptable | poly(hexamethylene terephthalate) |
| 17 | 1% NaOH | 35% Ethyl Alcohol | 50 | 0 | Acceptable | poly(decamethylene terephthalate) |
| 18 | 8% NaOH | 28% Ethyl Alcohol | 90 | 5 | Acceptable | poly(1,4-cyclohexane dimethylene terephthalate) |
| 19 | 2% KOH | 2% Propyl Alcohol | 120 | 65 | Acceptable | poly(ethylene-1,5 naphthalate) |
| 20 | 20% Ca(OH)$_2$ | 10% Methyl Alcohol | 200 | 80 | Acceptable | poly(ethylene-2,6-naphthalate) |
| 21 | 10% Ba(OH)$_2$ | 8% Ethyl Alcohol | 400 | 75 | Acceptable | poly(1,4-cyclohexylidene dimethyleneterephthalate) (Kodel) (cis) |
| 22 | 5% Mg(OH)$_2$ | 16% Butyl Alcohol | 600 | 100 | Acceptable | poly(1,4-cyclohexylidene dimethyleneterephthalate) (Kodel) (trans) |
| 23 | 50% Ca(OH)$_2$ | 40% Methyl Alcohol | 800 | 30 | Acceptable | poly(4-aminobutyric acid) (nylon 4) |
| 24 | 10% Ba(OH)$_2$ | 35% Ethyl Alcohol | 900 | 130 | Acceptable | poly(6-aminohexanoic acid) (nylon 6) |
| 25 | .1% NaOH | 80% Methyl Alcohol | 5 | 100 | Acceptable | poly(7-aminoheptanoic acid) (nylon 7) |
| 26 | .5% KOH | 10% Acetone | 20 | 25 | Acceptable | poly(8-aminooctanoic acid) (nylon 8) |
| 27 | 10% NH$_4$OH | 50% Ethylene Glycol | 90 | 60 | Acceptable | poly(9-aminononanoic acid) (nylon 9) |
| 28 | 20% LiOH | 20% Dimethyl Amine | 180 | 50 | Acceptable | poly(10-aminodecanoic acid) (nylon 10) |
| 29 | 10% NaOH | 15% Isopropyl Alcohol | 15 | 40 | Acceptable | poly(11-aminoundecanoic acid) (nylon 11) |
| 30 | 5% KOH | 2% Ethyl Ether | 200 | 85 | Acceptable | poly(12-aminododecanoic acid) (nylon 12) |
| 31 | 30% LiOH | 6% Benzyl Alcohol | 240 | 100 | Acceptable | poly(hexamethylene adipamide) (nylon 6,6) |
| 32 | 5% NH$_4$OH | 4% Dodecyl Alcohol | 360 | 15 | Acceptable | poly(heptamethylene pimelamide) (nylon 7,7) |
| 33 | 25% NaOH | 40% Ethyl Alcohol | 10 | 25 | Acceptable | poly(octamethylene suberamide) (nylon 8,8) |
| 34 | 15% KOH | 30% Ethyl Alcohol | 15 | 40 | Acceptable | poly(hexamethylene sebacamide) (nylon 6,10) |
| 35 | 2% NaOH | 20% Methyl Alcohol | 90 | 85 | Acceptable | poly(nonamethylene azelamide) (nylon 9,9) |
| 36 | 19% NH$_4$OH | 16% Acetaldehyde | 600 | 100 | Acceptable | poly(decamethylene azelamide) (nylon 10,9) |
| 37 | 25% NaOH | 15% Isobutanol | 100 | 90 | Acceptable | poly(decamethylene sebacamide) (nylon 10,10) |
| 38 | 35% KOH | 19% Glycerol | 120 | 110 | Acceptable | poly[bis(4-aminocyclohexyl)methane-1,10-decanedicarboxamide] (Qiana) (trans) |
| 39 | 30% NH$_4$OH | 3% Heptyl Alcohol | 150 | 120 | Acceptable | poly(m-xylylene adipamide) |
| 40 | 25% KOH | 8% Pentyl Alcohol | 100 | 15 | Acceptable | poly(p-xylylene sebacamide) |
| 41 | 1% NaOH | 50% Ethyl Alcohol | 50 | 0 | Acceptable | poly(2,2,2-trimethylhexamethylene terephthalamide) |
| 42 | 8% NaOH | 30% Ethyl Alcohol | 90 | 5 | Acceptable | poly(piperazine sebacamide) |
| 43 | 2% KOH | 16% Propyl Alcohol | 120 | 65 | Acceptable | poly(metaphenylene isophthalamide) (Nomex) |
| 44 | 20% Ca(OH)$_2$ | 25% Methyl Alcohol | 80 | 200 | Acceptable | poly(p-phenylene terephthalamide) (Kevlar) |

[1]The remainder of the solution is water.

(a) exposing said material to a solution comprising water, one or more substantially water-soluble organic solvents and an effective amount of hydroxyl ions;
(b) coating said contacted material with a catalyst for electroless plating of one or more metals thereon; and
(c) depositing one or more metal coatings on said catalyzed material by electroless plating.

3. An improved process according to claim 2 wherein said one or more metals are selected from the group consisting of copper, nickel and cobalt.

4. An improved process according to claim 3 which further comprises depositing one or more additional metal coatings onto said metal coated material of step (c) by electroplating.

5. An improved process according to claim 4 wherein said one or more additional metals are selected from the group consisting of copper, nickel and chromium.

* * * * *